Sept. 29, 1970 W. G. BOYDEN 3,531,661
MONOSTABLE MULTIVIBRATOR CIRCUIT FOR GENERATING VOLTAGE VARIABLE PULSE WIDTHS OVER WIDE RANGES
Filed July 14, 1969
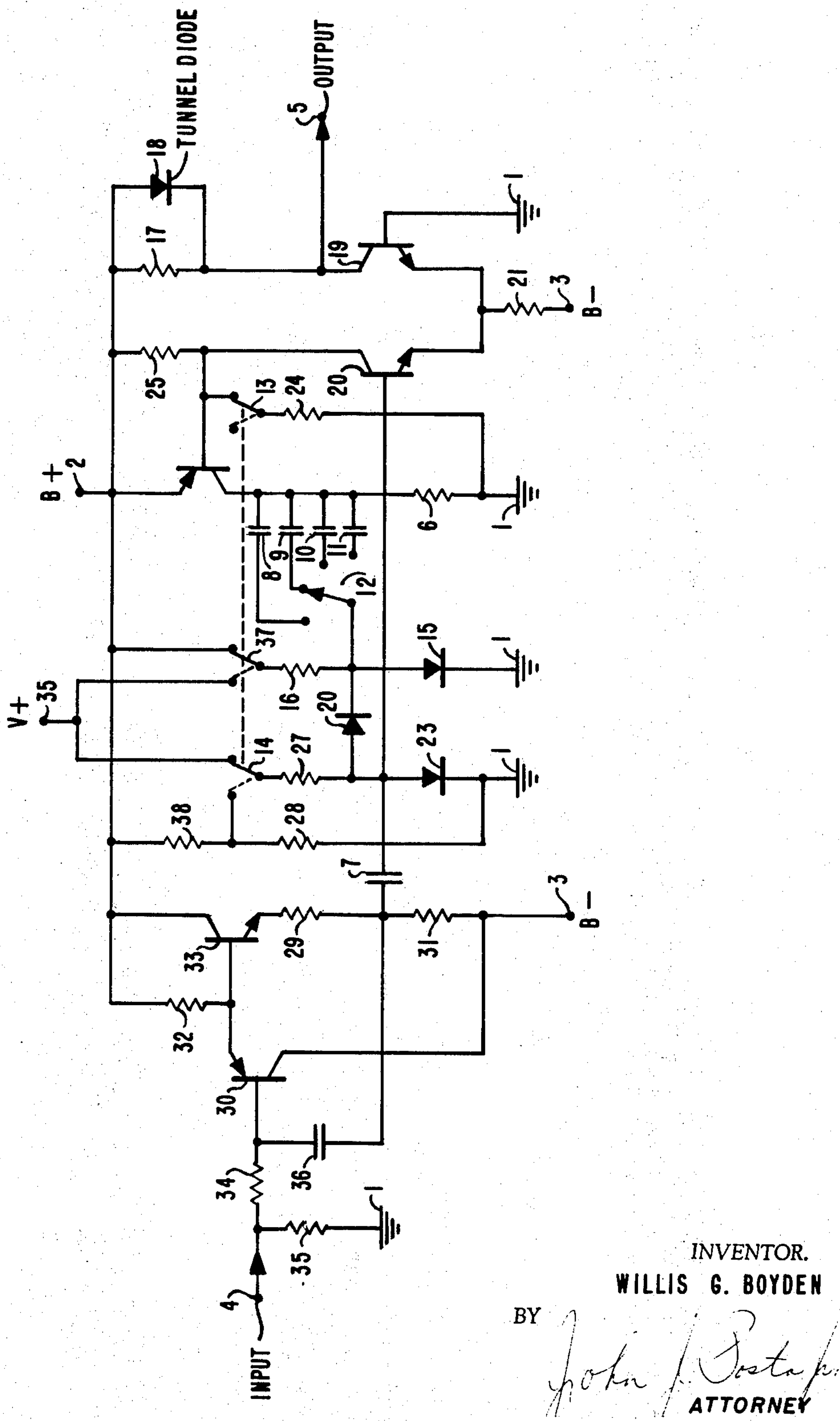
INVENTOR.
WILLIS G. BOYDEN
BY John J. Bostap Jr.
ATTORNEY United States Patent Office 3,531,661

Patented Sept. 29, 1970

3,531,661

MONOSTABLE MULTIVIBRATOR CIRCUIT FOR GENERATING VOLTAGE VARIABLE PULSE WIDTHS OVER WIDE RANGES

Willis Guild Boyden, 24 Press Ave., Norwood, Mass. 02062

Continuation-in-part of application Ser. No. 604,804, Dec. 27, 1966. This application July 14, 1969, Ser. No. 851,533

Int. Cl. H03k 3/10

U.S. Cl. 307—273 9 Claims

ABSTRACT OF THE DISCLOSURE

A triggering pulse is applied through an input amplifier to charge a small input capacitor that is connected through a diode switching arrangement to one of the control elements of a differential amplifier output stage. In a first mode of operation for producing very short duration pulses of variable width, this input capacitor is connected through a first discharge path to be discharged by current from a selectively variable control voltage. When the input triggering pulse ceases, the voltage across the small capacitor is applied as a negative potential through a diode switching arrangement to reverse the state of the differential amplifier output stage, thus generating an output pulse lasting until the input capacitor has been discharged at a rate proportional to the level of the control voltage. In the second mode for producing longer duration pulses, the small capacitor and one side of the diode switching arrangement is connected through the discharge path to a very small fixed voltage, instead of to the control voltage. One or more large feedback capacitors is charged through a normally open gating circuit and through a second discharge path to the control voltage. In this mode, upon receipt of the triggering pulse, the small capacitor charges as before to reverse the state of the differential amplifier output stage, which generates a feedback signal that closes the gating element to cut off the flow of charging current. The voltage across the charged, larger capacitor is applied through the diode switching arrangement to keep the differential amplifier in its reverse state until the larger capacitor has discharged through the second discharge path at a rate proportional to the level of the control voltage.

CROSS-REFERENCE TO RELATED APPLICATION

This application is a continuation-in-part application of my copending application entitled, "Single-Shot Multivibrators," filed Dec. 27, 1966, Ser. No. 604,804, now abandoned.

BACKGROUND OF THE INVENTION

Field of the invention

This invention relates to one-shot or monostable multivibrators with a variable pulse width, and more particularly, to such multivibrators that have pulse widths variable by the setting of a control voltage over widely different ranges from widths of one nanosecond or less up to a second or more.

Description of the prior art

Some prior pulse generating circuits, such as one-shot or monostable multivibrators, have had the capability of generating variable width pulses in response to an applied control voltage. Although some of these circuits were capable of generating an extensive range of different pulse widths through selection of different resistive-capacitive timing networks for each desired range of operation, very short pulses in the nanosecond range were beyond the capabilities of such conventional multivibrators. Heretofore, pulse generators operating in the nanosecond range have required special circuitry not generally compatible with conventional multivibrator circuits employed to generate variable width pulses of substantially greater width. If such pulses in the nanosecond range were required, it became necessary to employ an entirely different circuit with inherently different input and output characteristics from the conventional variable pulse width multivibrators.

SUMMARY OF THE INVENTION

The one-shot multivibrator, in accordance with this invention, provides a relatively simple circuit arrangement capable of operating in two different modes to provide voltage variable pulse widths ranging from a nanosecond or less up to a second or more. The circuit of the invention operates throughout this wide range of pulse widths in response to a standard input triggering pulse to generate pulses having a fixed amplitude and output impedance.

In either mode, a brief input triggering pulse actuates an input amplifier arrangement to charge a small capacitor coupled to the input of one of the pair of switching elements connected as a differential amplifier output stage. As the brief input triggering pulse ceases, the input amplifier stops charging of the small input capacitor, and the voltage developed across it is applied to change the voltage level at the input to the switching element to reverse the normal state of the differential amplifier, causing the output pulse to begin. The output pulse continues until the voltage at the input of this switching element is returned to its normal level.

In the first mode of operation, the voltage across the small input capacitor continues to be applied to the switching element input to maintain the differential amplifier in its reversed state until it is discharged by current supplied from the control voltage through a fixed resistance discharge path. The rate of discharge is proportional to the amplitude of the control voltage.

In the second mode of operation, the brief input pulse charges the small capacitor, as in the first mode, to initiate the output pulse by reversing the state of the differential output amplifier. However, a gating element responsive to a feedback signal from the differential output amplifier couples the greater voltage developed across a larger charged capacitor to the switching element input to maintain the differential output amplifier in its unstable state until the voltage on the larger capacitor has been discharged by current supplied from the control voltage through another fixed resistance discharge path.

A diode switching arrangement coupled between the small input capacitor with its discharge path and the larger capacitor with its discharge path effectively isolates the two modes of operation. A set of ganged mode selector switches is provided for connecting the limiting resistor in each discharge path so that one is connected to the control voltage and the other to a fixed potential to maintain appropriate bias for the diode switching arrangement to achieve the necessary intercoupling for each mode. The gating element is normally opened to deliver charging current to the larger capacitor elements used in the second mode of operation. In the first mode of operation, the setting of the selector switches provides a fixed bias to hold the gate open at all times. In the second mode, this fixed bias is disconnected, and the feedback signal from the differential output amplifier closes the gating element cutting off the charging current until the larger capacitor has been discharged to return the differential output amplifier to its normal state.

BRIEF DESCRIPTION OF THE DRAWING 16

The drawing illustrates in circuit diagram form a preferred embodiment of the voltage variable multivibrator with a wide range of pulse widths in accordance with the invention.

DESCRIPTION OF THE PREFERRED EMBODIMENT

Referring now to the drawing, which illustrates a preferred embodiment of the voltage variable multivibrator in accordance with the invention, a triggering pulse for initiating each output pulse is applied to an input terminal 4. In this instance, the triggering pulse is positive going having a constant potential of approximately two volts above the ground potential established at the common terminal 1 for two nanoseconds and a fall time of one nanosecond. The positive triggering pulse voltage is developed across the input resistor 35 connected between input terminal 4 and ground to be applied through a current limiting resistor 34 to the base of a PNP transistor 30 that has its collector coupled directly to the B− terminal 3, typically at approximately twelve volts negative with respect to ground. The emitter of transistor 30 is connected through a resistor 32 to the positive B+ terminal 2 of a power supply, typically at twelve volts positive with respect to ground potential. This circuit functions as a conventional emitter follower with transistor 30 conducting in its linear region to maintain its emitter, which is connected to the base of an NPN transistor 33, at slightly above ground potential. The NPN transistor 33 has its collector connected directly to the B+ terminal 2 and its emitter connected through a voltage divider network consisting of the series connected resistors 29 and 31 to a B− terminal 3 of the power supply, and also functions in an emitter follower mode to form a complementary emitter follower circuit arrangement.

With no input pulse, transistor 33 with its base at ground potential is normally conducting in its linear region to hold its emitter slightly above ground potential. The voltage drop across the divider resistor 29 at its common connecting point with resistor 31 is connected directly to the emitter of transistor 33 to provide a slightly negative potential on one plate of a small input capacitor 7, the other plate of which is coupled directly as a control signal to the base terminal of an NPN transistor 20 connected in a differential amplifier circuit with a matching NPN transistor 19. The transistor 19 and 20 receive a constant emitter current flow through a common emitter resistor 31 from the B− terminal 3. A switching diode 23 with its anode connected to the base of transistor 20 and its cathode at ground potential is normally biased in the forward direction by positive current flow through a resistor 27. Tris supplies a small positive voltage to the base of transistor 20, while the other transistor 19 of the differential amplifier has its base connected directly to ground potential, so that transistor 19 is normally nonconducting while transistor 20 conducts in saturation.

When a positive going input pulse appears at the input terminal 4 to drive the base transistor 30 positive, the potential at its emitter follows to raise the potential at the base of transistor 33, and at is emitter. The potential at the common terminal between the voltage divider resistor 29 and 31 likewise increases approximately two volts causing charging current to flow through the small input capacitor 7 and the forward biased diode 23 to ground. The small capacitor 7, with a capacitance of five to ten picofarads typically, is quickly charged to the two volt level of the input pulse. Thus the transistors 30 and 33 operating in complementary emitter follower fashion function as a two stage input amplifier with high input and low output impedance for quickly charging the small input capacitor 7 to the approximately voltage level of the input triggering pulse at the input terminal 4. A capacitor 36 coupled between the input and output of this amplifier arrangement stablizes its high frequency response.

As the input level returns to ground potential upon termination of the triggering pulse, the input amplifier arrangement returns to its previous state with the potential at the common terminal between the voltage divider resistor 29 and 31 being restored to its previous level at or near ground potential. The two volts now present across the charged input capacitor 7 results in a negative voltage being applied to the anode of the normally forward biased diode 23 to cut it off, and the charge on the small capacitor 7 begins to be discharged in a path from a positive potential through the resistor 27 and the divider resistor 31 to the B− terminal 3.

At the same time, this negative two volt potential across the input capacitor 7 is applied directly to the base terminal of the normally conducting transistor 20 in the differential output amplifier driving its base negative with respect to its emitter, and with respect to the base of the other transistor 19, to cut it off. The other transistor 19 thus begins conducting the constant emitter current being supplied through the common emitter resistor 21 from the B− terminal 3. The normally conducting transistor 20 has its collector coupled through a resistor 25 to the B+ terminal 2, while the other normally nonconducting transistor 19 has its collector connected to B+ through a resistor 17 in parallel with a tunnel diode 18. With output terminal 5 coupled directly to the collector of the transistor 19, when transistor 19 begins conducting, the output voltage quickly drops approximately one half volt below its normal B+ level, as determined by the forward voltage drop characteristic of the tunnel diode 18. The tunnel diode 18 has the advantage of giving very short rise and fall times for the output pulse because of its high speed switching, negative resistance characteristics, and the parallel connected resistor 17 merely provides a path for excess current flow that cannot be handled due to the very low current ratings of most tunnel diodes.

The negative going pulse thus generated at the output terminal 5 continues until the potential at the base of transistor 20 is restored from its negative level to at least ground potential, at which time transistor 20 switches back to its normally conducting state with transistor 19 return to its normally nonconducting state. The process by which this is accomplished, and the time required for its completion, depends upon which of two alternative modes of operation is selected by the setting of the ganged switches 13, 14 and 37.

In the first mode of operation, which may be employed for very short duration pulses, typically within a range starting at one nanosecond or less up to approximately twenty nanoseconds, the moveable contacts for the ganged switches 13, 14 and 37 are operated to the positions shown in the drawings to engage the fixed contacts on the right. In this position, switch 13 connects the base of a PNP gating transistor 26 through a resistor 24 to ground potential 1 to establish a constant current flow from the B+ terminal 2 through a resistor 25 to ground potential. The resistor 25 is coupled between the emitter and base terminals of the gating transistor 26 so that the voltage drop across it holds gating transistor 26 conducting in saturation, even when transistor 20 is switched from its normally conducting state to nonconduction to initiate an output pulse. Conversely, in the second mode of operation, as hereinafter described, transistor 26, which provides current for selectively charging certain ones of different sized capacitors 8, 9, 10 and 11, selected by setting of a range selection switch 12, is cut off when the output pulse begins.

The position of the switch 37 for the first mode of operation connects the terminal 2 directly through a resistor 16 to the anode of a switching diode 15 with its cathode at ground potential. The small positive voltage across the forward biased diode 15 also is applied to the cathode of another switching diode 22 that interconnects the input capacitor 7 with the selected one of the larger capacitors 8–11, as well as their respective discharge resistors 16 and 27. The position of switch 14 in the first mode connects the V+ control voltage terminal 35 through the fixed resistor 27 to the anodes of the switching diodes 22 and 23 to establish a voltage variable discharge path for the small capacitor 7.

In the first mode of operation for very short duration pulses, the output pulse width is determined by the time required for the V+ control voltage to discharge the input capacitor 7, after termination of the triggering pulse sufficiently to return the base of transistor 20 from the minus two volt level to ground potential. The discharge path for the small input capacitor 7 is from the B− terminal 3 through resistor 31, input capacitor 7, and the discharge resistor 27 to the V+ control voltage terminal 35. The amplitude of the current flow through the discharge resistor 27 is directly proportional to the voltage difference across it, so that with the V+ control voltage at a maximum, the negative two volts on the small capacitor 7 can be discharged very quickly to produce output pulses of one nanosecond or less. Of course, the time constant of this discharge path depends upon the resistance value of resistor 27 in comparison with the capacitance value of the capacitor 7. As the amplitude of the control voltage V+ is lowered, the flow of discharge current is decreased proportionally to lengthen the width of the output pulse.

In this first mode, the setting of the switch 37 maintains a forward bias on the diode 15 to establish a slight positive potential at the cathode of the switching diode 22. Since its anode has the negative potential of the charged capacitor 7 during discharge, the diode 22 is reverse biased to maintain it cutoff during discharge, thus isolating the discharge path for the capacitor 7 from the discharge path for the capacitors 8–11 used in the second mode of operation.

In the second mode of operation, the movable contacts of the switches 13, 14 and 37 are moved to their alternative positions shown in the drawing on the left side. The switch 13 in this position disconnects the resistor 24 from the base of the gating transistor 26 so that the only current path available through the biasing resistor 25 is through the normally conducting transistor 20. Prior to receipt of a triggering pulse at the input 4, the current conducted through transistor 20 maintains a voltage drop across resistor 25 for keeping the gating transistor conducting in saturation. But, at the end of the triggering pulse, as the transistor 20 is cut off by the negative voltage on its base from the input capacitor 7, current flow through resistor 25 stops removing the forward emitter-to-base voltage drop necessary to maintain the gating transistor 26 conducting, and it is cutoff.

The previous saturation current flow through gating transistor 26 has charged the selected one of the capacitors 8–11 through the range selection switch 12, which in the drawing is shown connected to the capacitor 9, and the diode 15 to ground, so that the voltage across it is approximately equal to the B+ voltage level. However, when the output pulse begins, the cutting off of the gating transistor 26 disconnects the positively charged plate of the capacitor 9 from the B+ terminal 2, leaving it instead connected to ground through the resistor 6. Since the B+ voltage on the capacitor 9 is greater than the two volts developed across the input capacitor 7, the larger negative potential across the capacitor 9 appearing at the selector switch 12 is applied to the cathode of the switching diode 22 biasing it in the forward direction so that this larger negative potential is coupled to the base of the transistor 20 to maintain it in the nonconducing state.

In this second mode of operation, the selected larger capacitor 9 begins to discharge from ground potential through the resistor 6. Positive discharge current is supplied for the most part from the V+ control voltage terminal 35 through the switch 37 and through the fixed discharge resistor 16. With the alternative setting of the switch 14 for the second mode, the resistor 27 is connected to the common terminal between the series connected voltage divider resistors 38 and 28 that have resistance values to provide a fixed voltage of approximtaely one half volt at the common terminal between them, so that a very small secondary discharge current is also supplied through the resistor 27 and the diode 22 for the selected capacitor 9. This maintains the diode 22 biased in the forward direction until the base of transistor 20 has been returned to ground potential to restore the initial state of the differential amplifier, while also providing a discharge path for the small capacitor 7. As may be seen, the rate at which the selected capacitor 9 discharges is largely determined by the selected amplitude of the V+ control voltage at terminal 35 since the flow of charging current through the fixed discharge resistor 16 is directly proportional to the voltage difference between this V+ control voltage and the negative voltage existing across capacitor 9.

Each of the larger capacitors 8–11 have progressively larger capacitance values that permit selection of successive pulse width ranges. Also, the capacitors 8–11 may be provided with a range selection switching arrangement for connecting two or more of the capacitors in parallel to provide combined capacitance values for greater range selection. The rate of discharge for any setting of the V+ control voltage of the terminal 35 may also be varied in other ways to change the time constant of the primary discharge path through resistors 6 and 16, such as by varying the resistance values.

When the selected capacitor has discharged sufficiently to return the base of the transistor 20 to ground potential, the normally conducting transistor 20 cuts on to begin conducting again as the other transistor 19 of the differential amplifier cuts off, thus ending the negative pulse at the output 5. As current flow is restored through the transistor 20, a voltage drop again appears across the resistor 25 to bias the gating transistor 26 back into saturation to quickly recharge the selected larger capacitor 9 through the switch 12 and the diode 15 before receipt of the next triggering pulse at the input 4.

Accordingly, it may be seen that this circuit operates in a first mode essentially as an amplifier with a slight delay provided by discharge of the input capacitor 7 to produce very short duration pulses, the width of which can be varied by setting the V+ control voltage used to discharge the small input capacitor 7. In the second mode, a feedback signal generated by the reversal in the state of the output differential amplifier cuts off the gating transistor 26 that is used to charge the selected larger capacitors 8 thru 11, which are then discharged through a separate discharge path in accordance with the setting of the V+ control voltage. In either mode, the negative going output pulse has very short rise and fall times with the width being continuously variable within the selected range from a nanosecond up to a second or more, by varying the magnitude of the positive V+ control voltage.

What is claimed and desired to be secured by United States Letters Patent is:

1. A monostable multivibrator for generating output pulses with a constant amplitude having a duration variable by the amplitude of a control voltage over widely differing ranges in response to an input triggering pulse, comprising:

an output amplifier responsive to the level of a signal voltage for generating an output pulse with said constant amplitude so long as said signal voltage differs in a given direction from a reference level;

input charging means;

circuit means responsive to said input triggering pulse for charging said input charging means to a first preselected voltage level during the occurrence of said input pulse and responsive to the termination of said input pulse for connecting said input charging means to said output amplifier means to apply said first preselected voltage to said output amplifier as a signal voltage differing in said given direction from the reference level to initiate said output pulse;

a feedback charging means;

gating means responsive to the operation of said output amplifier for charging said feedback charging means to a second preselected voltage substantially greater than said small voltage;

a first discharge path having a relatively short time constant for discharging said input charging means;

a second discharge path having a relatively longer time constant for discharging said feedback charging means;

a variable control voltage source for selectively discharging either said input charging means or said feedback charging means;

selectively operable switching means having alternative settings for connecting said control voltage source to either said first or said second discharge paths, and for maintaining a fixed bias on said gating means when said control voltage is coupled to second discharge path; and a unidirectional intercoupling network between said input and said feedback charging means and between said first and second discharging paths for selectively coupling said first or said second preselected voltages to said output amplifier, in accordance with the setting of said switching means, to maintain the generation of said output pulse until said input or said feedback charging means have been discharged to said reference level by said control voltage source.

2. The monostable multivibrator of claim 1 wherein:

said output amplifier includes a differential amplifier having a pair of switching element inputs, one of said inputs being connected to receive said predetermined signal voltage and the other of said inputs being coupled through said intercoupling means to upon termination of said input triggering pulse to said impulse capacitor and to said feedback capacitor.

3. A voltage variable multivibrator circuit for generating output pulses having a width variable over different ranges in accordance with the amplitude of a control voltage comprising:

a differential output amplifier means having parallel connected switching elements each having a control terminal, the control terminal of one of said switching elements being coupled to a reference potential and the control element of the other switching element being coupled to reecive a signal voltage;

input means responsive to each input triggering pulse for generating a first signal voltage differing from said reference potential in a given direction for changing the state of said output amplifier means from a normal state, in which current flows through one of said switching elements, to a reverse state, in which current flows through the other switching element, to initiate an output pulse;

capacitor means having selectively variable discharge time constants corresponding to each of said different ranges;

gating means responsive to the changing of said output amplifier means from its normal to its reverse state for charging said capacitor means prior to initiation of said output pulse to a preselected second signal voltage differing in said given direction from said reference potential and for terminating the charging of said capacitor means and coupling said second signal voltage upon initiation of said output pulse to the control terminal of said other switching element to maintain the signal voltage differing in said given direction from said reference potential during discharge of said capacitor means; and, a variable control voltage source for selectively discharging said capacitor means at a rate proportional to the amplitude of said control voltage to maintain said output amplifier means in its reverse state until said capacitor means has been discharged to return the signal voltage to the level of said reference potential.

4. The voltage variable multivibrator circuit of claim 3 wherein:

said input means includes a small input capacitor connected to be charged during said triggering pulse for providing said first signal voltage upon termination of said triggering pulse and a discharge path for said input capacitor having a relatively short time constant; and said control voltage source includes switching means for selectively disabling said gating means and connecting said control voltage to discharge said input capacitor.

5. A voltage variable multivibrator circuit for generating output pulses having width variable in response to a control voltage over a plurality of different ranges with minimum pulse durations in the order of one nanosecond or less, comprising:

an input capacitor;

means responsive to an input triggering pulse for charging said input capactor to a first fixed voltage level and for dischraging said input capacitor through a fixed resistance path upon termination of said input pulse;

output means having switching elements responsive to said charging means and said first fixed voltage level on said input capacitor for initiating said output pulse upon termination of said input pulse and responsive to a predetermined signal voltage level for terminating said output pulse;

feedback capacitor means;

selectively operable feedback circuit means responsive to said output means for charging said feedback capacitor means in the absence of said output pulse to a second fixed voltage level greater than said first fixed voltage level and for selectively discharging said feedback capacitor means through a second fixed resistance path upon initiation of said output pulse;

a source of variable control voltage for selectively discharging either said input capacitor or said feedback capacitor means;

selector switch means having a first position for selectively enabling said feedback means and coupling said feedback capacitor means to be discharged by said control voltage source through said second fixed resistance path upon initiation of said output pulse, and having a second position for disabling the said feedback means and coupling capacitor to be discharged by said control voltage source through said first fixed resistance path; and intercoupling means for coupling either said input capacitor or said feedback capacitor means during discharge by said control voltage to the switching elements of said output means to maintain said output pulse until said first or said second fixed voltage levels has been reduced by discharging to said predetermined operating level.

6. The multivibrator circuit of claim 1 wherein:

said other capacitor comprises of plurality of individual capacitors having different capacitance values larger than that of said input capacitor, and range selector switching means for selectively coupling said capacitors to said feedback means to provide a preselected pulse width range.

7. The multivibrator circuit of claim 5 wherein:

said output means comprises a differential amplifier circuit with parallel switching elements each having a control terminal, a reference voltage corresponding to said predetermined operating level applied to the control terminal of one of said switching elements with said input capacitor and said feedback capacitor means being charged to different first and second fixed voltage levels in the same polarity with respect to said reference level to be applied to the control terminal of said other switching element to be returned to said reference level during discharging.

8. The multivibrator circuit of claim 7 wherein:

said intercoupling means comprises a unidirectional switching means coupled between said input capacitor and said other capacitor to be actuated in the forward direction during discharge of said feedback capacitor means in response to the difference between said first and said second fixed voltage levels, whereby the greater voltage of said feedback capacitor means is coupled to the control terminal of said other switching element to maintain said output pulse.

9. The multivibrator circuit of claim 5 wherein:

said feedback circuit means comprises a gating means having a control terminal coupled to said output means, said control terminal being coupled to receive a fixed bias with said selector switch means in said second position for maintaining a continuous flow of current to said feedback capacitor means and being operable with said selector switch means in said first position for terminating the flow of current to said feedback capacitor means upon initiation of said output pulse.

References Cited

UNITED STATES PATENTS

| | | | |
|---|---|---|---|
| 3,175,152 | 3/1965 | Shafer | 307—276 |
| 3,231,761 | 1/1965 | Keller et al. | 307—273 |
| 3,383,524 | 5/1968 | Garrahan | 307—265 |

JOHN S. HEYMAN, Primary Examiner

J. D. FREW, Assistant Examiner

U.S. Cl. X.R.

07—265, 266, 267, 276